United States Patent
Lee et al.

(10) Patent No.: US 11,456,261 B2
(45) Date of Patent: Sep. 27, 2022

(54) SEMICONDUCTOR PACKAGE STRUCTURES AND METHODS OF MANUFACTURING THE SAME

(71) Applicant: Advanced Semiconductor Engineering, Inc., Kaohsiung (TW)

(72) Inventors: Hui-Yu Lee, Kaohsiung (TW); Hui-Chen Hsu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/100,553

(22) Filed: Nov. 20, 2020

(65) Prior Publication Data
US 2022/0165682 A1 May 26, 2022

(51) Int. Cl.
*H01L 23/00* (2006.01)
*H01L 23/31* (2006.01)
*H01L 23/495* (2006.01)
*H01L 21/56* (2006.01)
*H01L 21/48* (2006.01)

(52) U.S. Cl.
CPC ........ *H01L 23/562* (2013.01); *H01L 21/4825* (2013.01); *H01L 21/4828* (2013.01); *H01L 21/565* (2013.01); *H01L 23/3114* (2013.01); *H01L 23/4952* (2013.01); *H01L 23/49503* (2013.01); *H01L 23/49541* (2013.01)

(58) Field of Classification Search
CPC ............... H01L 23/562; H01L 23/3114; H01L 23/49503; H01L 23/4952; H01L 23/49541; H01L 21/4825; H01L 21/4828; H01L 21/565
See application file for complete search history.

(56) References Cited

U.S. PATENT DOCUMENTS 8,575,742 B1 * 11/2013 Kim .................. H01L 23/49541
257/730
9,202,777 B2 12/2015 Tay et al.
9,631,481 B1 * 4/2017 Bae ...................... G01N 29/024

* cited by examiner

*Primary Examiner* — Marc Anthony Armand
(74) *Attorney, Agent, or Firm* — Foley & Lardner LLP

(57) ABSTRACT

A semiconductor package structure includes a semiconductor package structure includes a first supporting bar, a second supporting bar and an encapsulant. The second supporting bar is adjacent to the first supporting bar. The first supporting bar and the second supporting bar extend substantially along a first direction. The encapsulant covers the first supporting bar and the second supporting bar. The encapsulant defines a first recess and a second recess recessed from a lower surface of the encapsulant. The first recess extends substantially along a second direction different from the first direction. The second recess is located between the first recess and the second supporting bar.

14 Claims, 21 Drawing Sheets

SEMICONDUCTOR PACKAGE STRUCTURES AND METHODS OF MANUFACTURING THE SAME

BACKGROUND

1. Field of the Disclosure

The present disclosure relates to semiconductor package structures and methods of manufacturing the same.

2. Description of Related Art

A multi-row QFN structure has been developing for a requirement of more leads. However, half-etching a supporting bar with a greater length may result in deformation and/or break of the supporting bar. Further, the pitch between the supporting bars has been reducing, which may incur short circuit after solders are formed due to a less pitch between the supporting bars. In order to solve aforementioned problems, a new semiconductor package structure is required.

SUMMARY

According to some embodiments of the present disclosure, a semiconductor package structure includes a first supporting bar, a second supporting bar and an encapsulant. The second supporting bar is adjacent to the first supporting bar. The first supporting bar and the second supporting bar extend substantially along a first direction. The encapsulant covers the first supporting bar and the second supporting bar. The encapsulant defines a first recess and a second recess recessed from a lower surface of the encapsulant. The first recess extends substantially along a second direction different from the first direction. The second recess is located between the first recess and the second supporting bar.

According to some embodiments of the present disclosure, a semiconductor package structure includes a die paddle, an encapsulant, a plurality of first terminals and a plurality of second terminals. The encapsulant covers the die paddle. The encapsulant has a lower surface. The plurality of first terminals are disposed on the lower surface of the encapsulant. Each of the plurality of first terminals is aligned to each other along a first direction. The plurality of second terminals are disposed on the lower surface of the encapsulant. Each of the plurality of second terminals is aligned to each other along the first direction. Each of the plurality of first terminals is positioned farther from the die paddle than each of the plurality of second terminals is. The encapsulant includes a first recess and a plurality of second recesses recessed from the lower surface of the encapsulant, the first recess surrounds the die paddle, and each of the second terminals is aligned to one corresponding second recess along a second direction perpendicular to the first direction.

According to some embodiments of the present disclosure, a method of manufacturing a semiconductor package structure includes: providing a lead frame, wherein the lead frame includes a die paddle, a first linking bar, a first supporting bar and a second supporting bar, wherein the first supporting bar and the second supporting bar connect the first linking bar; forming an encapsulant covering the lead frame, wherein a lower surface of the first linking bar and a portion of the second supporting bar are exposed from the encapsulant; and removing the first linking bar and the portion of the second supporting bar such that the first supporting bar is electrically isolated from the second supporting bar.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
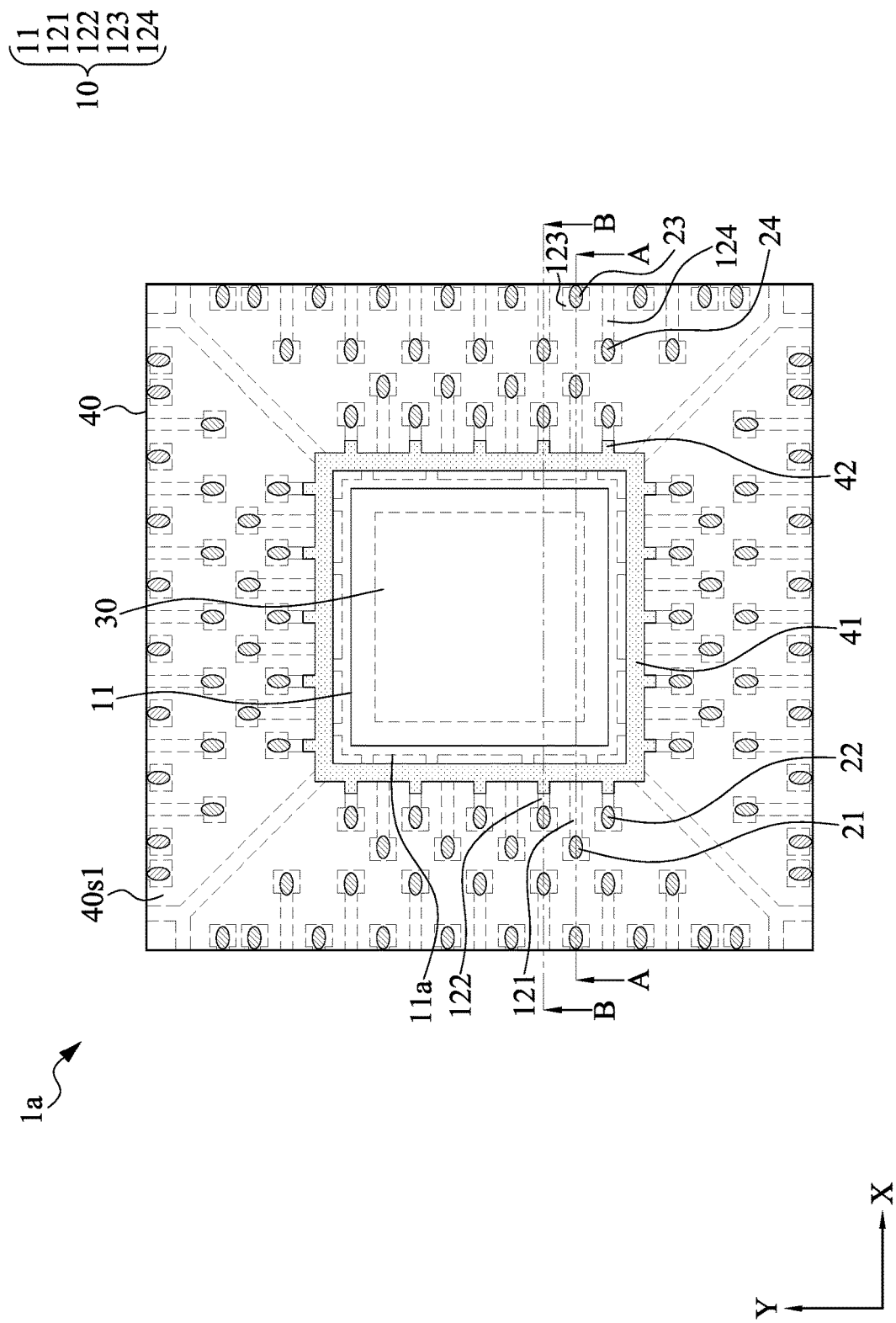
FIG. 1 is a bottom view of a semiconductor package structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, however, that the present disclosure provides many applicable concepts that can be embodied in a wide variety of specific contexts. The specific embodiments discussed are merely illustrative and do not limit the scope of the disclosure.

The present disclosure describes techniques suitable for the manufacture of semiconductor package structures with a main recess and multiple sub recesses. The formation of the main recess may assist in reducing the length of supporting bars, thereby preventing deformation of the supporting bars. The sub recesses may let extruded solder material fill in during attaching a motherboard to the semiconductor package structure, thereby preventing from extruded solder material connecting two terminals incurring short circuit.

FIG. 1 is a bottom view of a semiconductor package structure 1a in accordance with some embodiments of the present disclosure. The semiconductor package structure 1a may include a lead frame 10, a plurality of terminals 21, a plurality of terminals 22, a plurality of terminals 23, a plurality of terminals 24, a semiconductor die 30 and an encapsulant 40. The lead frame 10 and the semiconductor die 30 may be covered by a surface 40$s$1 (or a lower surface) of the encapsulant 40, and are illustrated with dotted-lines, respectively.

The lead frame 10 may include a die paddle 11, a plurality of supporting bars 121, a plurality of supporting bars 122, a plurality of supporting bars 123 and a plurality of supporting bars 124. The die paddle 11 and the supporting bars 121, 122, 123 and 124 can be made of copper, copper alloy or another suitable metal or alloy. In some embodiments, the die paddle 11, the supporting bars 121, 122, 123 and 124 may include one or a combination of the following: iron, nickel, iron alloy, nickel alloy or any other suitable metal or metal alloy.

The die paddle 11 may be configured to, for example, serve as a carrier on which the semiconductor die 30 is disposed. The supporting bars 121, 122, 123 and 124 may be separated from the die paddle 11, respectively.

The plurality of supporting bars 121 may surround the die paddle 11. A portion of the supporting bars 121 may be aligned to each other along a direction parallel to X-axis or Y-axis. For example, the portion of the supporting bars 121 that are adjacent to a side 11a of the die paddle 11 may be aligned to each other along a direction parallel to Y-axis. Further, these supporting bars 121 may extend along a direction parallel to X-axis, which is orthogonal to the arrangement direction of the supporting bars 121.

The plurality of supporting bars 122 may surround the die paddle 11. The supporting bars 122 and the supporting bars 121 may be arranged alternatively. A portion of the supporting bars 122 may be aligned to each other along a direction parallel to X-axis or Y-axis. For example, the portion of the supporting bars 122 that are adjacent to the side 11a of the die paddle 11 may be aligned to each other along a direction parallel to Y-axis. Further, these supporting bars 122 may extend along a direction parallel to X-axis. In some embodiments, the supporting bar 122 may have a length greater than that of the supporting bar 121.

The plurality of supporting bars 123 may surround the die paddle 11. A portion of the supporting bars 123 may be aligned to each other along a direction parallel to X-axis or Y-axis. For example, the portion of the supporting bars 123 that are adjacent to the side 11a of the die paddle 11 may be aligned to each other along a direction parallel to Y-axis. The supporting bars 123 may be disconnected from the die paddle 11. The supporting bars 123 may be spaced apart from a recess 41 and a recess 42. The supporting bars 123 are disposed farther from the die paddle 11 than the supporting bars 121 are. One of the supporting bars 123 may be aligned to one of the supporting bars 121 along a direction that parallel to the extension direction of the supporting bar 121 or supporting bar 123.

The plurality of supporting bars 124 may surround the die paddle 11. The supporting bars 124 and the supporting bars 123 may be arranged alternatively. A portion of the supporting bars 124 may be aligned to each other along a direction parallel to X-axis or Y-axis. For example, the portion of the supporting bars 124 that are adjacent to the side 11a of the die paddle 11 may be aligned to each other along a direction parallel to Y-axis. The supporting bars 124 are disposed farther from the die paddle 11 than the supporting bars 121 are. One of the supporting bars 124 may be aligned to one of the supporting bars 122 along a direction that parallel to the extension direction of the supporting bar 122 or supporting bar 124.

The terminals 21, 22, 23 and 24 may be disposed on the surface 40$s$1 of the encapsulant 40. The terminals 21, 22, 23 and 24 may be exposed from the surface 40$s$1 of the encapsulant 40. The terminals 21, 22, 23 and 24 may cover the surface 40$s$1 of the encapsulant 40. In some embodiments, The terminals 21, 22, 23 and 24 may be disposed with different distances from the die paddle 11. For example, the terminal 21 may be disposed farther from the die paddle 11 than the terminal 22 is; the terminal 23 may be disposed farther from the die paddle 11 than the terminal 24 is. The terminals 21, 22, 23 and 24 may include pre-plated frame (PPF). The terminals 21, 22, 23 and 24 may include conductive materials, such as metal or other suitable materials.

The plurality of terminals 21 may surround the die paddle 11. A portion of the terminals 21 may be aligned to each other along a direction parallel to X-axis or Y-axis. For example, the portion of the terminals 21 adjacent to the side 11a of the die paddle 11 may be aligned to each other along a direction parallel to Y-axis. The terminal 21 may be disposed on the supporting bar 121. One of the terminals 21 may be disposed corresponding to one of the supporting bars 121.

The plurality of terminals 22 may surround the die paddle 11. A portion of the terminals 22 may be aligned to each other along a direction parallel to X-axis or Y-axis. For example, the portion of the terminals 22 adjacent to the side 11a of the die paddle 11 may be aligned to each other along a direction parallel to Y-axis. The terminal 22 may be disposed on the supporting bar 122. One of the terminals 22 may be disposed corresponding to one of the supporting bars 122. The terminals 21 and the terminals 22 may be arranged alternatively. The terminal 21 may be positioned farther from the die paddle 11 than the terminal 22 is.

The terminal 23 may be disposed on the supporting bar 123. The terminal 23 may be positioned farther from the die paddle 11 than the terminal 21 is. The terminal 24 may be disposed on the supporting bar 124. The terminal 24 may be positioned farther from the die paddle 11 than the terminal 22 is.

The semiconductor die 30 may be disposed on the die paddle 11. The semiconductor die 30 may include one or more semiconductor dies in the form of one or more integrated circuits (ICs) (such as packaged semiconductor dies). In some embodiments, the semiconductor die 30 may include, but is not limited to, at least one active component such as MEMS die or another active component. In some embodiments, the semiconductor die 30 may be or include, but is not limited to, one or more gyroscopes, accelerometers, pressure sensors, microphones, actuators, mirrors, heaters, printer nozzles magnetometers, or a combination of two or more thereof. In some embodiments, the semiconductor die 30 may include, but is not limited to, at least one passive component such as a capacitor, a resistor, or another passive component.

The encapsulant 40 may encapsulate the semiconductor die 30. The encapsulant 40 may cover the supporting bars 121, 122, 123 and 124. The encapsulant 40 may include insulation or dielectric material. In some embodiments, the encapsulant 40 may be made of molding material that may include, for example, a Novolac-based resin, an epoxy-based resin, a silicone-based resin, or other another suitable encapsulant. Suitable fillers may also be included, such as powdered $SiO_2$.

In some embodiments, the encapsulant 40 may define a recess 41 on the surface 40s1. The recess 41 may be disposed between the terminal 21 and the die paddle 11. The recess 41 may be disposed between the terminal 22 and the die paddle 11. The recess 41 may be recessed from the surface 40s1 of the encapsulant 40. The recess 41 may surround the die paddle 11. The recess 41 may include a ring-shaped profile or other suitable profiles. The recess 41 may extend along a direction orthogonal to the extension direction of adjacent supporting bar 121. For example, the portion of the recess 41 adjacent to the die paddle 11a may extend along a direction parallel to the Y-axis, which is orthogonal to the extension direction of adjacent supporting bar 121.

In some embodiments, the encapsulant 40 may define a plurality of recesses 42 on the surface 40s1. The recess 42 may be disposed between the terminal 21 and the die paddle 11. The recess 42 may be recessed from the surface 40s1 of the encapsulant 40. The recess 42 may surround the die paddle 11. A portion of the recesses 42 may be aligned to each other along a direction parallel to X-axis or Y-axis. For example, the portion of the recesses 42 adjacent to the side 11a of the die paddle 11 may be aligned to each other along a direction parallel to Y-axis. In some embodiments, the recess 42 may extend along a direction orthogonal to the extension direction of the recess 41. For example, the recess 42 adjacent to the 11a may extend along a direction parallel to the X-axis, while the recess 41 may extend along a direction parallel to the Y-axis. In some embodiments, one of the recesses 42 may be aligned to one corresponding terminal 21 along a direction parallel to the extension direction of the supporting bar 121.

The semiconductor package structures and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
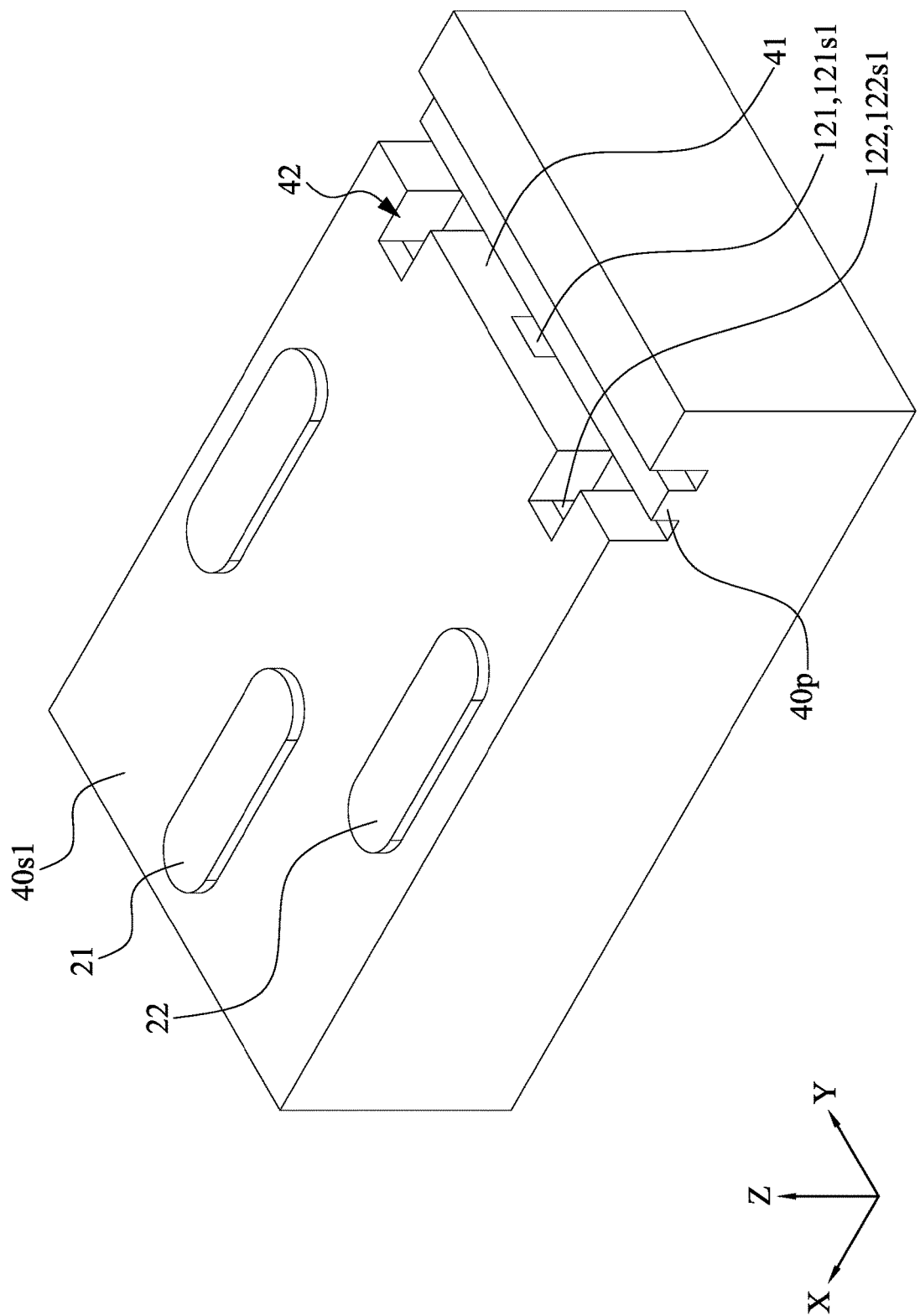
FIG. 2 is a partial perspective view of the semiconductor package structure of FIG. 1.

FIG. 2 is a partial perspective view of the semiconductor package structure 1a. In some embodiments, the recess 41 may connect the recess 42. In some embodiments, the recess 42 may be disposed between the recess 41 and the terminal 22. In some embodiments, the recess 42 may be disposed between the recess 41 and the supporting bar 122. The recess 42 may extend from the recess 41 toward the terminal 22. In some embodiments, the supporting bar 122 may have a surface 122s1 (or a lateral surface) that is exposed from the recess 42. In some embodiments, the supporting bar 121 may have a surface 121s1 (or a lateral surface) that is exposed from the recess 41. In some embodiments, the supporting bar 121 may be disposed between two adjacent recess 42.

Figure 3:
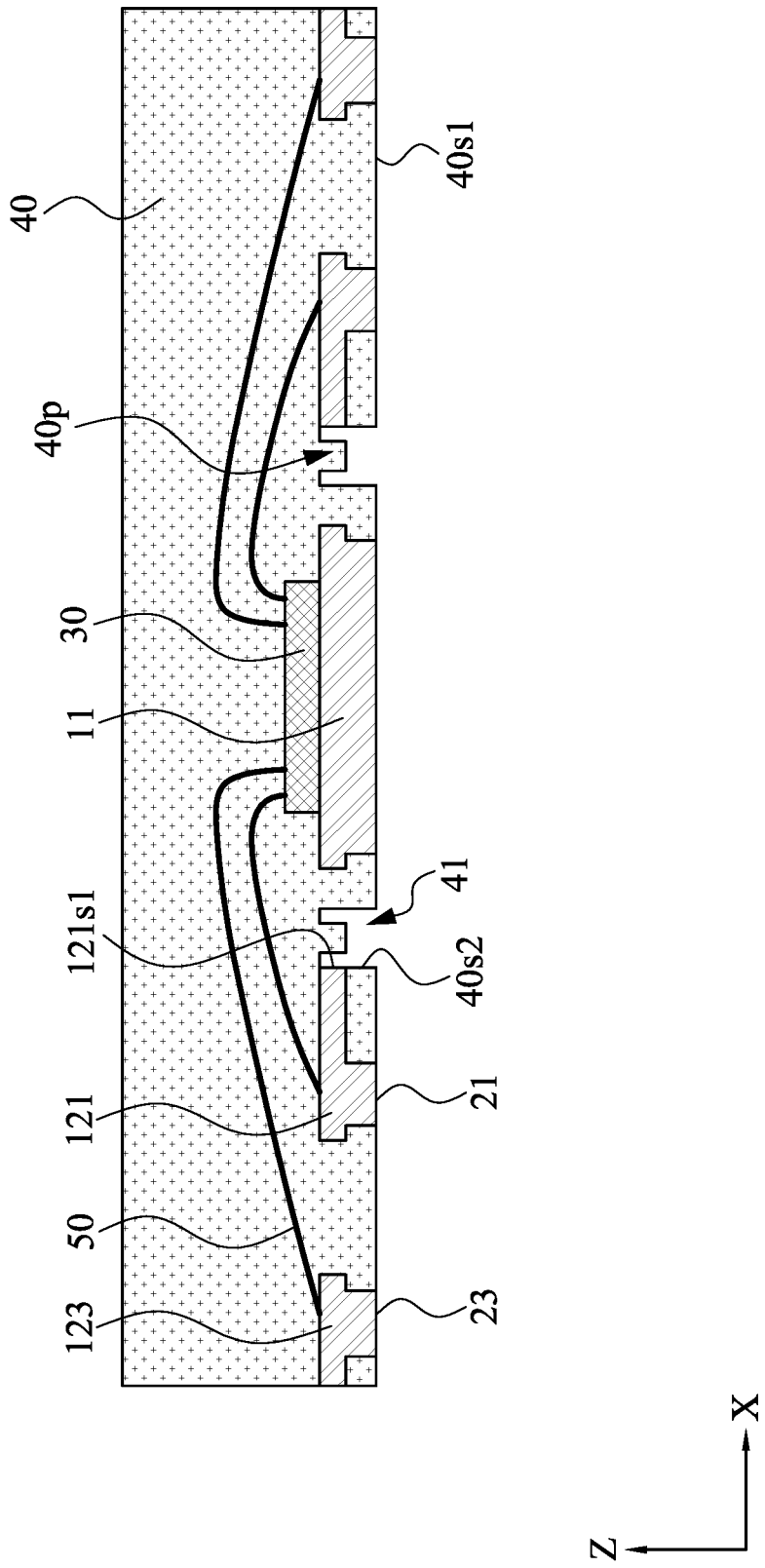
FIG. 3 is a cross-section along the line A-A of the semiconductor package structure of FIG. 1.

FIG. 3 is a cross-section along the line A-A of the semiconductor package structure 1a. The semiconductor package structure 1a may include a wire bond 50. The wire bond 50 may be configured to electrically connect the semiconductor die 30 and the supporting bar 121 or 123. In some embodiments, the encapsulant 40 may include a protruding portion 40p disposed within the recess 41. The protruding portion 40p may disposed on a bottom of the recess 41. The protruding portion 40p may have a ring-shaped profile from a bottom view. The protruding portion 40p may exposed from the encapsulant 40. The protruding portion 40p may be disposed between the supporting bar 121 and the die paddle 11. The surface 121s1 of the supporting bar 121 may face the die paddle 11. The surface 121s1 of the supporting bar 121 may be coplanar with a surface 40s2 (or a lateral surface) of the encapsulant 40. A portion of the encapsulant 40 may be disposed between the recess 41 and the supporting bar 121. Although FIG. 3 illustrates that the edge of the supporting bar 123 is half etched such that the supporting bar 123 has a recess in which a portion of the encapsulant 40 fills in, the supporting bar 123 may not be etched in other embodiments.

Figure 4:
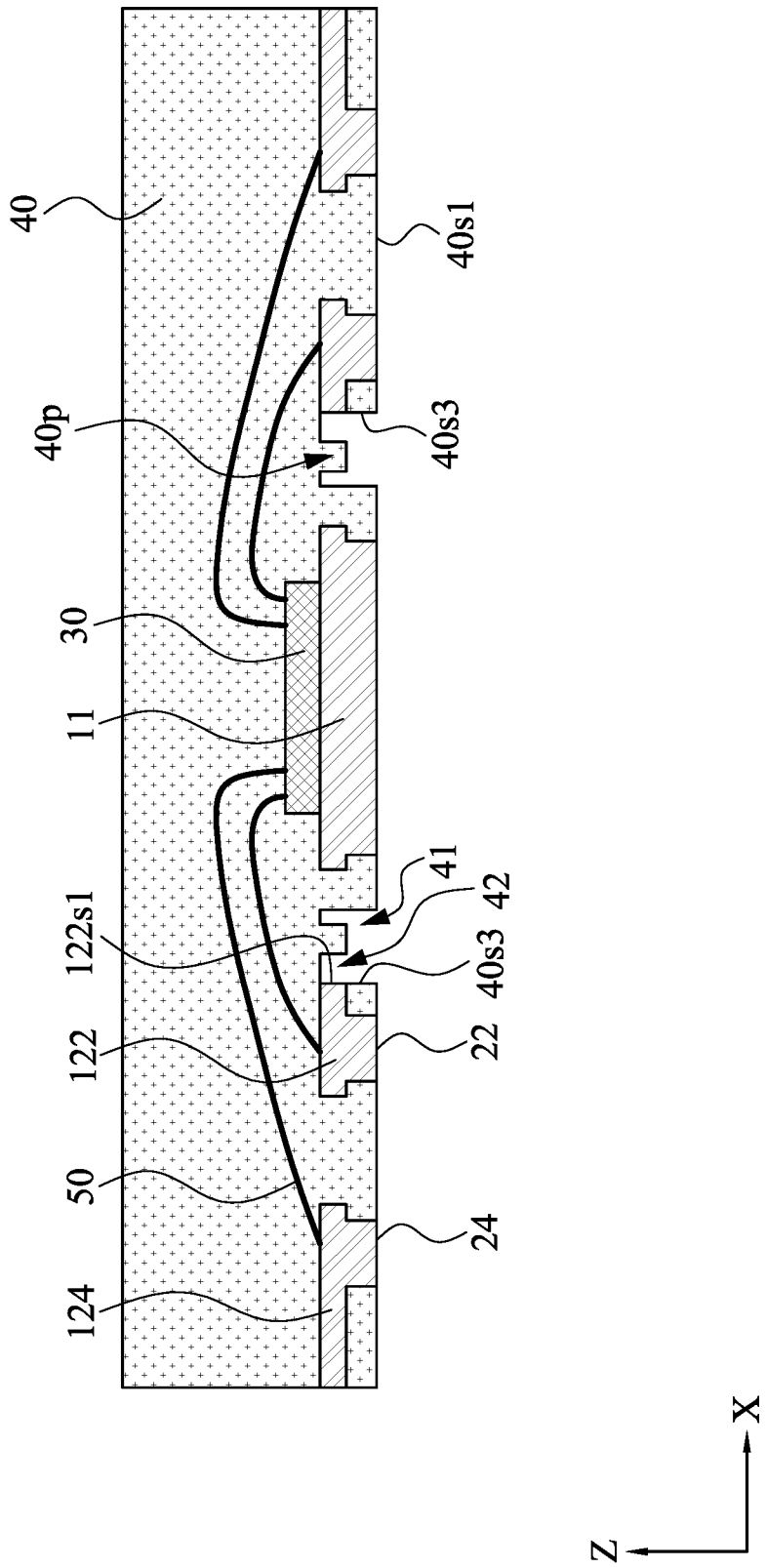
FIG. 4 is a cross-section along the line B-B of the semiconductor package structure of FIG. 1.

FIG. 4 is a cross-section along the line B-B of the semiconductor package structure 1a. The wire bond 50 may be configured to electrically connect the semiconductor die 30 and the supporting bar 122 or 124. The surface 122s1 of the supporting bar 122 may face the die paddle 11. The surface 122s1 of the supporting bar 122 may be coplanar with a surface 40s3 (or a lateral surface) of the encapsulant 40. A portion of the encapsulant 40 may be disposed between the recess 42 and the supporting bar 122. As shown in FIGS. 2, 3 and 4, the surface 122s1 of the supporting bar 122 may be disposed farther from the die paddle 11 than the surface 121s1 of the supporting bar 121 is; the surface 40s3 of the encapsulant 40 may be disposed farther from the die paddle 11 than the surface 40s2 of the encapsulant 40 is.

The terminal 21 and the terminal 22 may be attached to a motherboard (not shown) through coating solder material to connect the terminal 21 and the motherboard, or connect the terminal 22 and the motherboard. In a comparative example, no recess 42 is formed. In such case, when the motherboard is attached to terminals, the solder material may be extruded and electrically connect two adjacent terminals. As a result, the semiconductor package structure may incur short circuit. In this embodiment, the recess 42 may provide an additional space let extruded solder material fill in, thereby preventing from short circuit.

Figure 5:
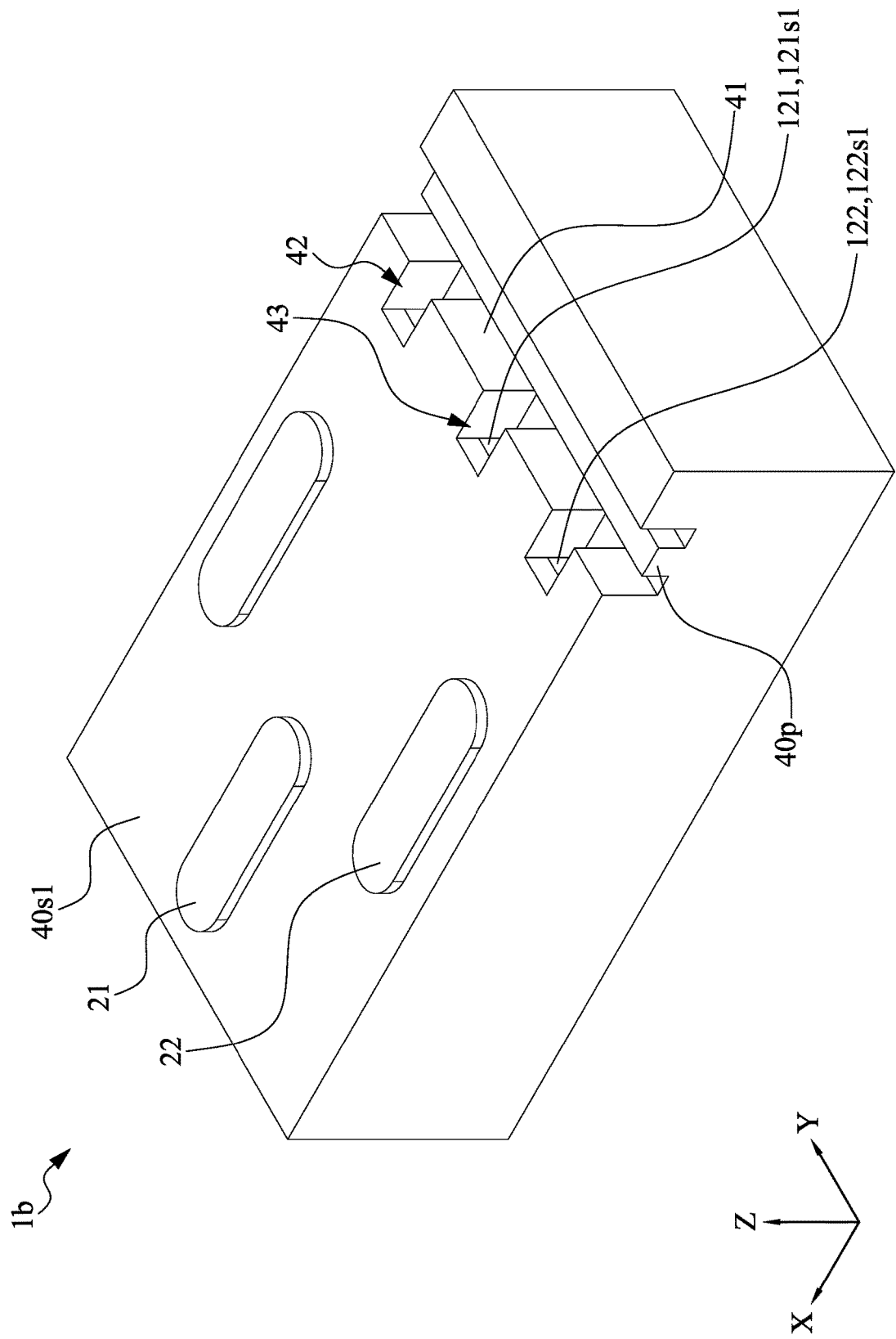
FIG. 5 is a partial perspective view of a semiconductor package structure in accordance with some embodiments of the present disclosure.

FIG. 5 is a partial perspective view of a semiconductor package structure 1b in accordance with some embodiments of the present disclosure. The semiconductor package structure 1b of FIG. 5 has a similar structure to that of the semiconductor package structure 1a of FIG. 2 except that the semiconductor package structure 1b further include a recess 43. The recess 43 may be disposed between the terminal 21 and the recess 41. The recess 43 may be aligned to the terminal 21 along a direction parallel to the extension direction of the supporting bar 121. In some embodiments, the recess 43 may connect the recess 41. In some embodiments, the recess 43 may not connect the recess 41. The recess 43 may extend from the recess 41 toward the terminal 21. In some embodiments, the surface 121s1 of the supporting bar 121 may be exposed from the recess 43. Although FIG. 5 illustrates that the recess 43 may have a profile the same as that of the recess 42, the recess 43 may have a profile different from that of the recess 42 in other embodiments.

Figure 6:
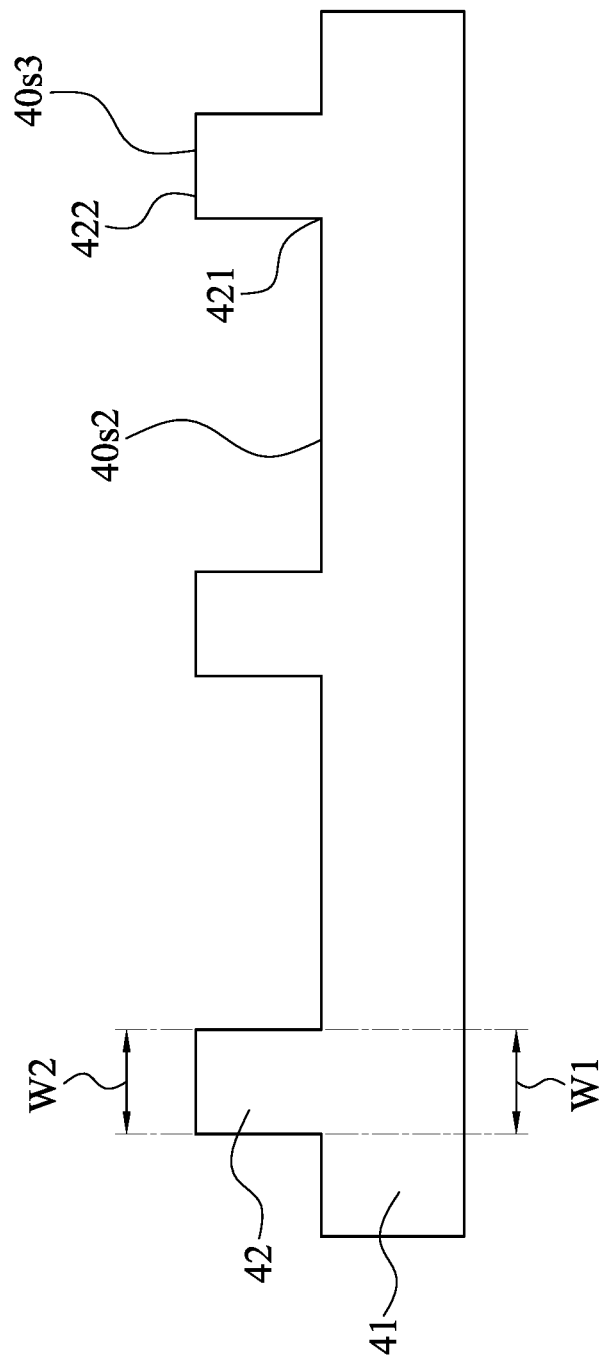
FIG. 6 illustrates the profile of recesses in accordance with some embodiments of the present disclosure.

FIG. 6 illustrates the profile of the recess 42 in accordance with some embodiments of the present disclosure. The recess 42 may have an open end 421 adjacent to the recess 41 and a close end 422 far from the recess 41. The open end 421 may connect the recess 41. The close end 422 may expose the lateral surface 122$s$1 of the supporting bar 122. In some embodiments, the aperture W1 of the recess 42 at the open end 421 may be substantially the same as the aperture W2 of the recess 42 at the close end 422.

Figure 7:
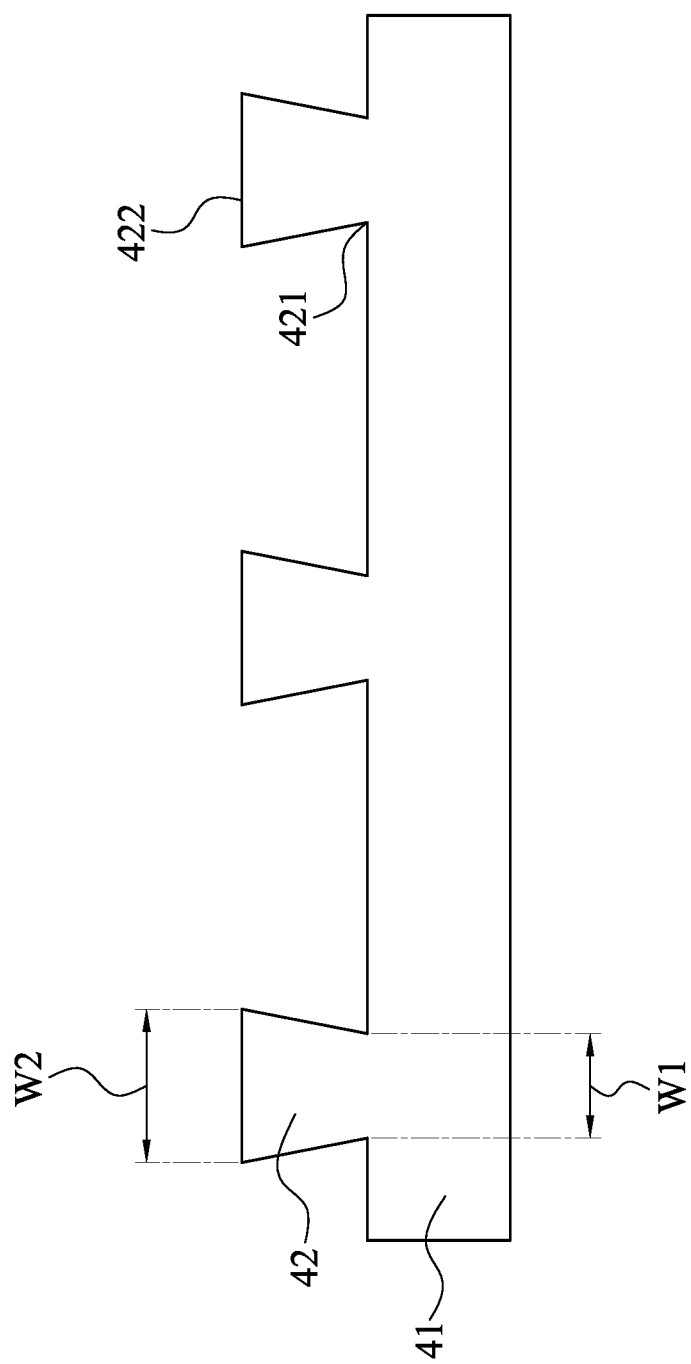
FIG. 7 illustrates the profile of recesses in accordance with some embodiments of the present disclosure.

FIG. 7 illustrates the profile of the recess 42 in accordance with some embodiments of the present disclosure. In some embodiments, the aperture W1 of the recess 42 at the open end 421 may be different from the aperture W2 of the recess 42 at the close end 422. In some embodiments, the aperture W1 of the recess 42 at the open end 421 may be less than the aperture W2 of the recess 42 at the close end 422. That is, the aperture of the recess 42 may taper off from the closed end 422 to the open end 421 of the recess 42. The greater aperture W2 may assist in extruded solder material filling into the recess 42. The smaller aperture W1 at the open end 421 may prevent solder material from filling out and thus prevent from short circuit. As a result, the short circuit of the semiconductor package structure may further be prevented.

Figure 8:
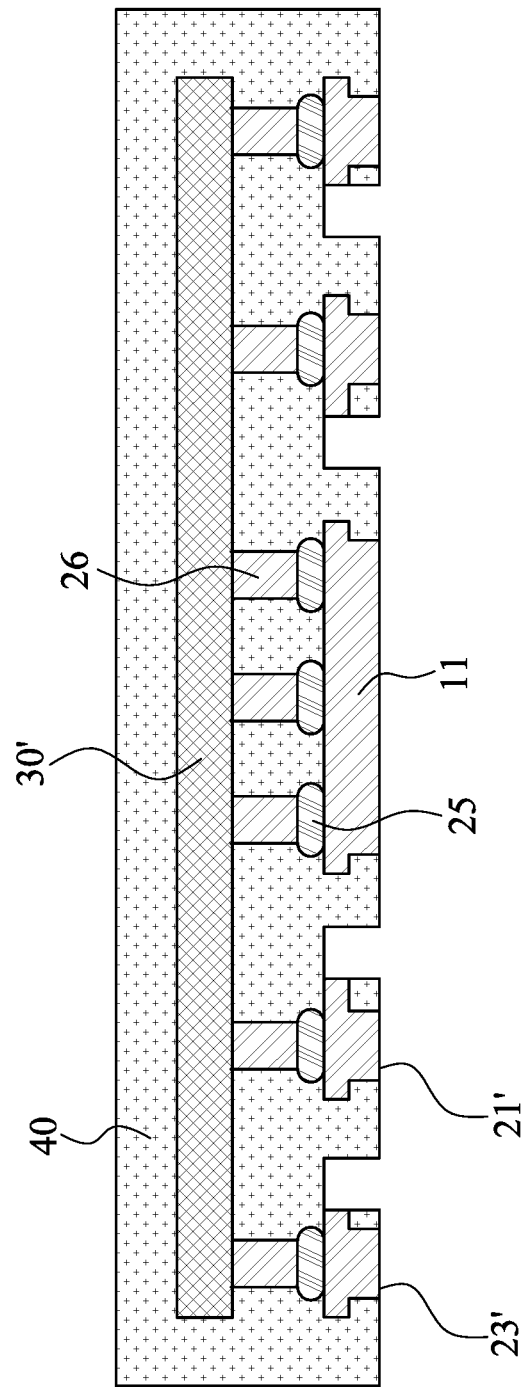
FIG. 8 is a cross-section of a semiconductor package structure in accordance with some embodiments of the present disclosure.

FIG. 8 is a cross-section of a semiconductor package structure 1$c$ in accordance with some embodiments of the present disclosure. The semiconductor package structure 1$c$ of FIG. 8 has a similar structure to that of the semiconductor package structure 1$a$ of FIG. 3 except that the semiconductor die 30' of the semiconductor package structure 1$c$ is bonded to the die paddle 11 through a flip-chip technique. The semiconductor die 30' may be attached to the lead frame 10 through a plurality of electrodes 26 and pads 25.

Figure 9:
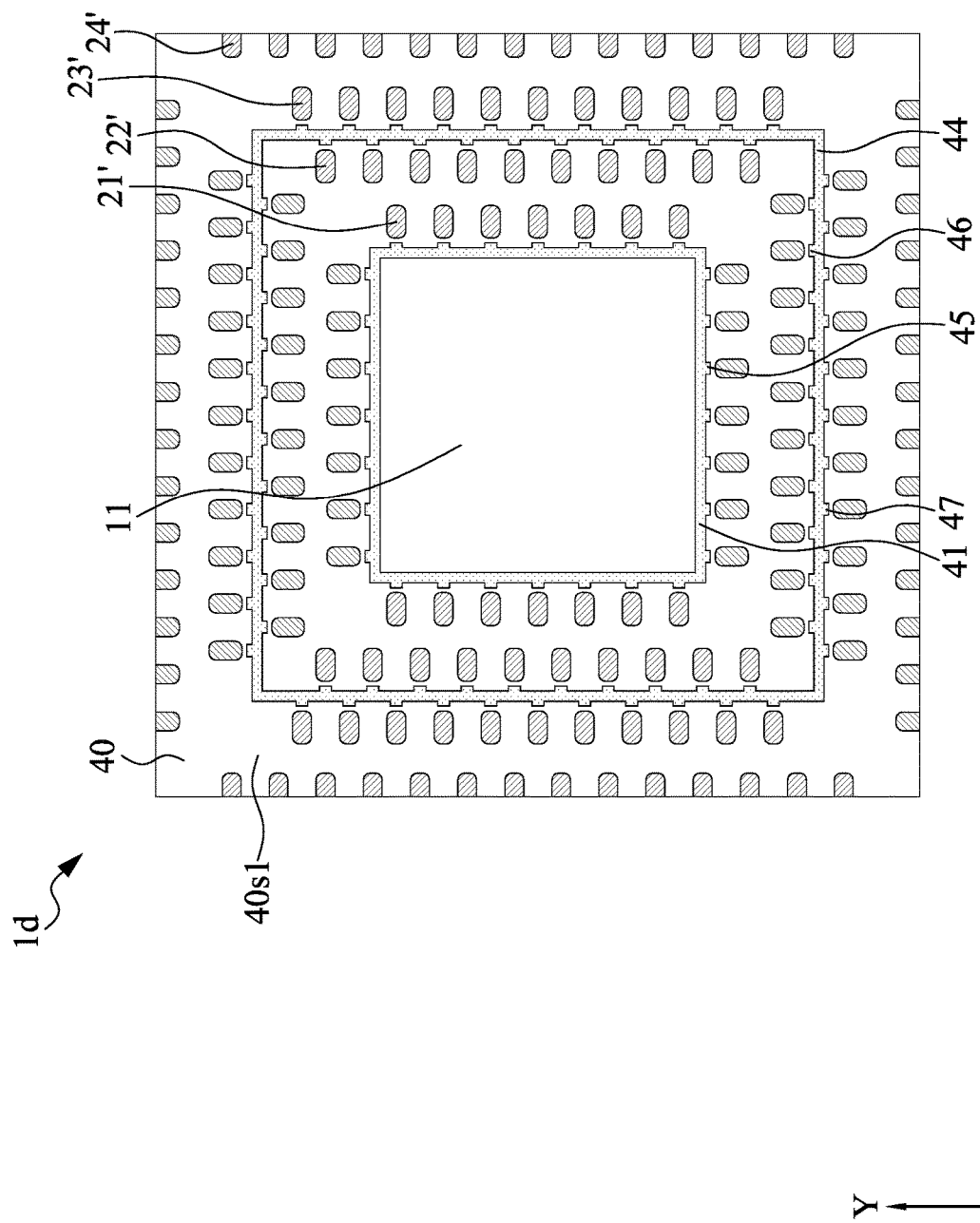
FIG. 9 is a bottom view of a semiconductor package structure in accordance with some embodiments of the present disclosure.

FIG. 9 is a bottom view of a semiconductor package structure 1$d$ in accordance with some embodiments of the present disclosure. The semiconductor package structure 1$d$ of FIG. 9 has a similar structure to that of the semiconductor package structure 1$a$ of FIG. 1 except that the encapsulant 40 of the semiconductor package structure 1$d$ may further define a recess 44, a plurality of recesses 45, a plurality of recesses 46 and a plurality of recesses 47.

The recess 44 may surround the recess 41. The recess 44 may have a ring-shaped profile. The terminal 21' and the terminal 22' may be disposed between the recess 41 and the recess 44. The terminal 23' and the terminal 22' may be disposed on opposite sides of the recess 44. The terminal 24' may be positioned farther from the die paddle 11 than the terminal 23' is. The recess 45 may connect the recess 41. The recess 45 may be aligned to the terminal 21'. The recess 46 may connect the recess 44. The recess 46 may be aligned to the terminal 22'. The recess 47 may connect the recess 44. The recess 47 may be aligned to the terminal 23'. The recess 46 and the 47 may be arranged alternatively.

FIG. 10A, FIG. 10B, FIG. 10C, FIG. 11A, FIG. 11B, FIG. 11C, FIG. 12A, FIG. 12B and FIG. 12C illustrate various stages of a method for manufacturing a semiconductor package structure in accordance with some embodiments of the present disclosure. FIG. 10A, FIG. 11A, FIG. 12A and FIG. 13A illustrate from the bottom view; FIG. 10B, FIG. 11B, FIG. 12B and FIG. 13B illustrate along line A-A of FIG. 10A, FIG. 11A, FIG. 12A and FIG. 13A, respectively; FIG. 10C, FIG. 11C, FIG. 12C and FIG. 13C illustrate along line B-B of FIG. 10A, FIG. 11A, FIG. 12A and FIG. 13A, respectively.

Figure 10A:
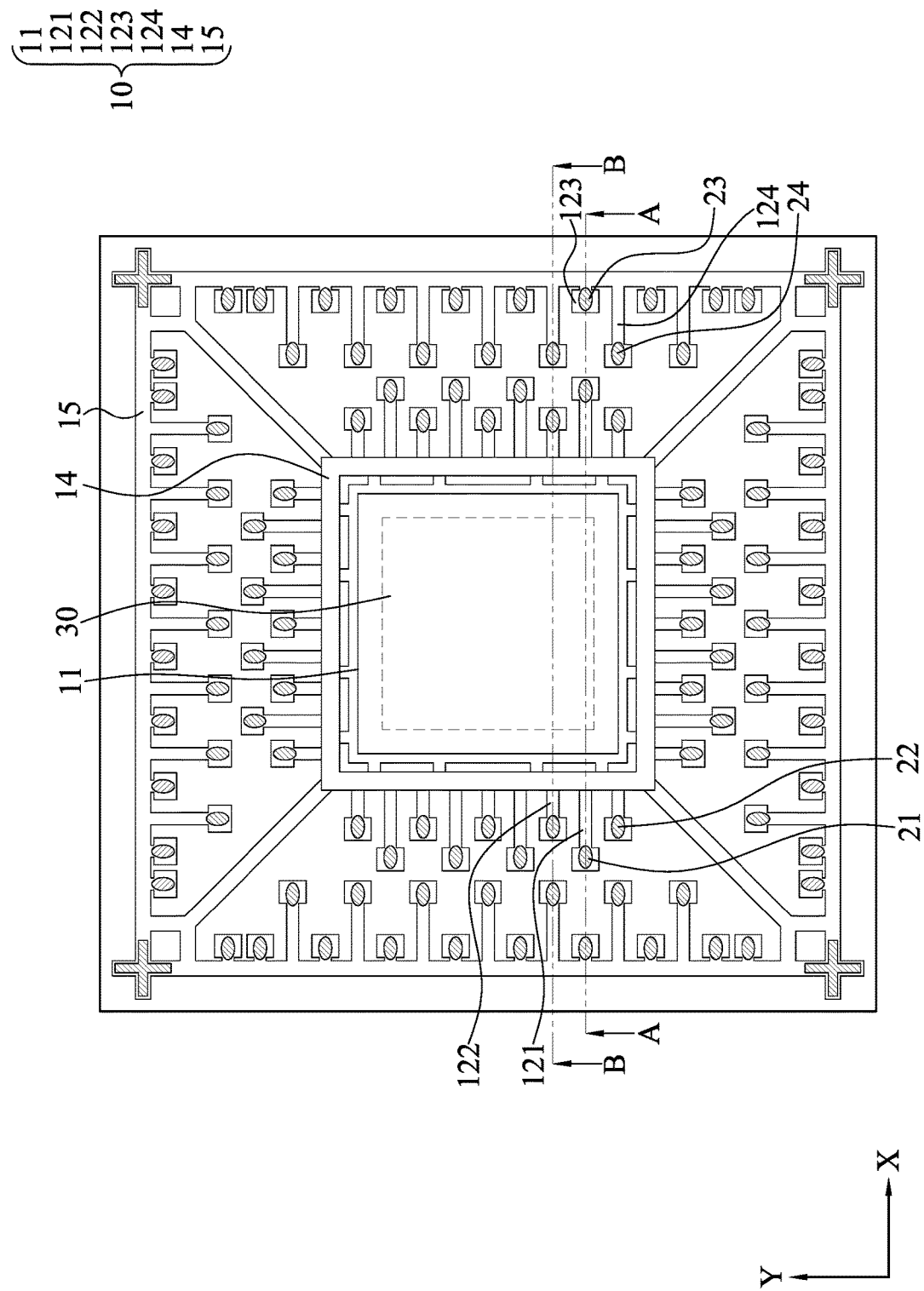
FIGS. 10A, 10B, 10C, 11A, 11B, 11C, 12A, 12B, 12C, 13A, 13B and 13C illustrate various stages of a method for manufacturing a semiconductor package structure in accordance with some embodiments of the present disclosure.

Referring to FIG. 10A, a lead frame 10 may be provided. In some embodiments, the lead frame 10 may include a die paddle 11, a plurality of supporting bars 121, 122, 123 and 124. In some embodiments, the lead frame 10 may include a linking bar 14 (or an inner linking bar) and a linking bar 15 (or an outer linking bar). The linking bar 14 may be disposed between supporting bar 121 and the die paddle 11. The linking bar 14 may enclose the die paddle 11. In some embodiments, the linking bar 14 may connect the supporting bar 121 and the supporting bar 122. The linking bar 15 may be separated from the linking bar 14. The linking bar 15 may enclose the linking bar 14. The linking bar 15 may be separated from the supporting bar 121 and the supporting bar 122. The linking bar 15 may connect the supporting bar 123 and the supporting bar 124.

Figure 10B:
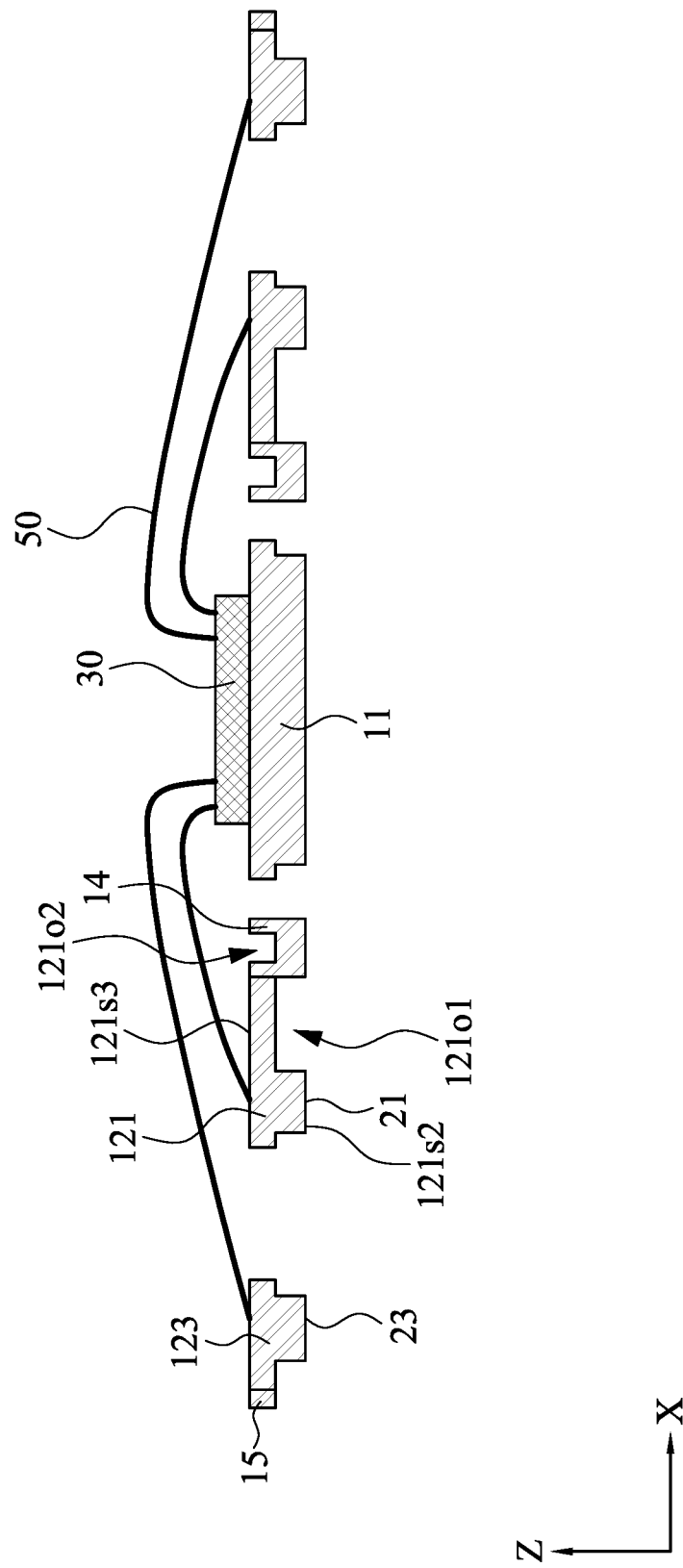
Figure 10C:
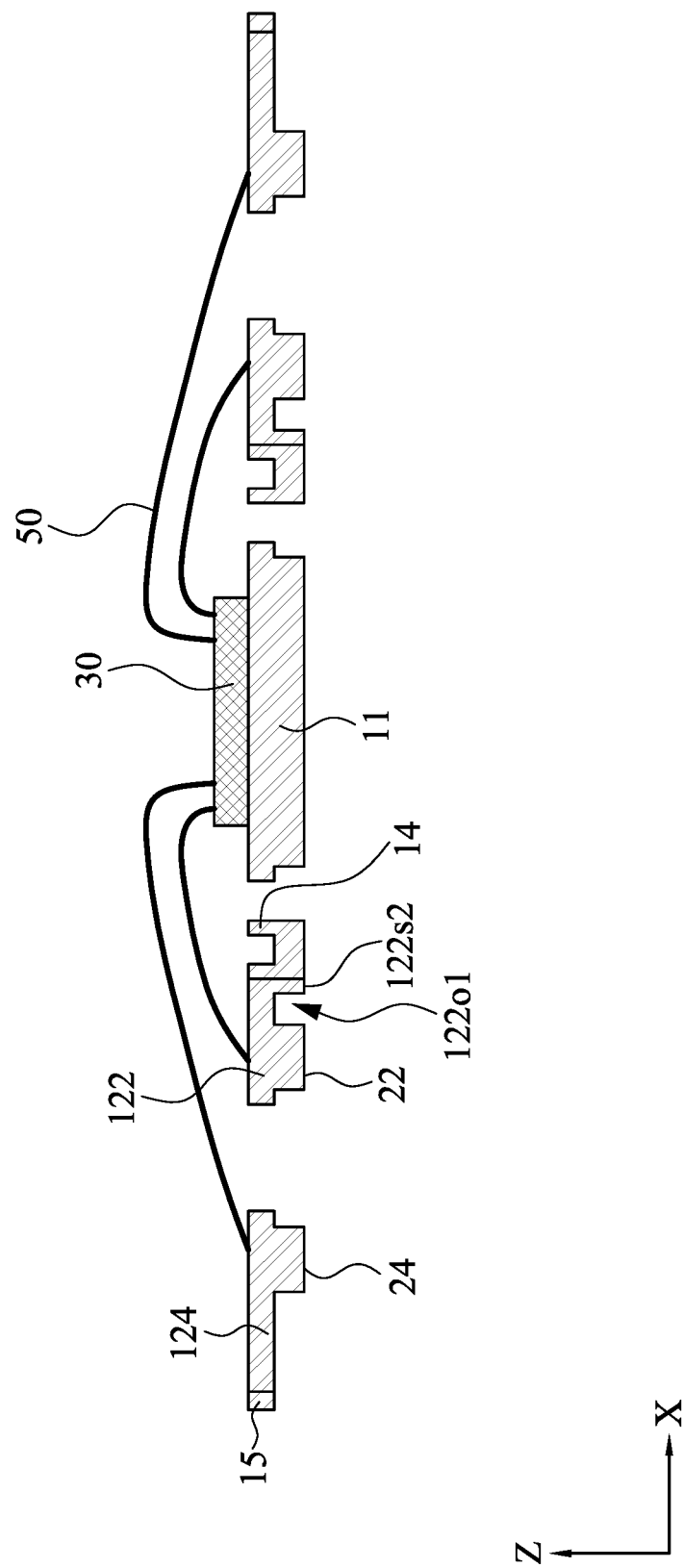

As shown in FIGS. 10B and 10C, The terminals 21, 22, 23 and 24 may be disposed on the supporting bars 121, 122, 123 and 124, respectively. The terminals 21, 22, 23 and 24 may be disposed on, for example, the bottom surface of the supporting bars 121, 122, 123 and 124, respectively. The semiconductor die 30 may be disposed on the die paddle 11. The wire bond 50 may connect the semiconductor die 30 and the supporting bar 121, 122, 123 or 124. The wire bond 50 may connect the semiconductor die 30 and the upper surface of the supporting bar 121, 122, 123 or 124. A portion of a surface 121$s$2 (or a lower surface) of the supporting bar 121 may be covered by the terminal 21. A portion of the surface 122$s$2 (or a lower surface) of the supporting bar 122 may be covered by the terminal 22. In some embodiments, the supporting bar 121 may include a blind hole 121$o$1 recessed from the surface 121$s$2 of the supporting bar 121. In some embodiments, a blind hole 121$o$2 may be recessed from an upper surface of the linking bar 14. In other embodiments, a blind hole 121$o$2 may be recessed from a surface 121$s$3 of the supporting bar 121. The blind hole 121$o$1 may be free from overlapping the blind hole 121$o$2. In some embodiments, the supporting bar 122 may include a blind hole 122$o$1 recessed from the surface 122$s$2 of the supporting bar 122. In some embodiments, the aperture of the blind hole 121$o$1 may be different from the blind hole 122$o$1. In some embodiments, the aperture of the blind hole 121$o$1 may be greater than that of the blind hole 122$o$1. In some embodiments, the thickness of the linking bar 14 may be greater than that of the linking bar 15.

Referring to 11A, an encapsulant 40 is formed. The terminals 21, 22, 23 and 24 are exposed from the surface 40$s$1 of the encapsulant 40. In some embodiments, the lower surface of the linking bar 14 may be exposed from the surface 40$s$1 of the encapsulant 40. In some embodiments, the lower surface of the linking bar 15 may be covered from the surface 40$s$1 of the encapsulant 40.

Figure 11A:
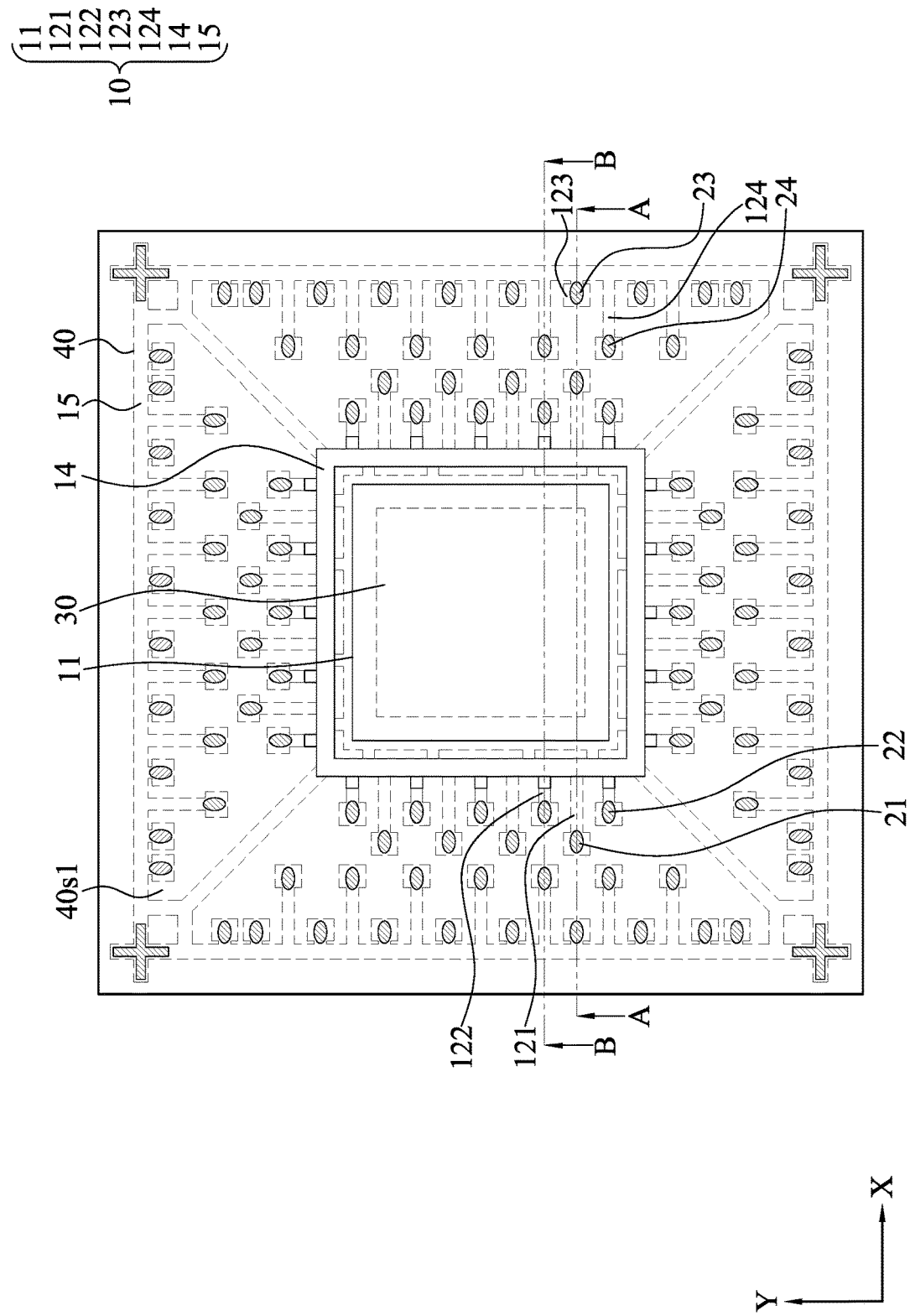
Figure 11B:
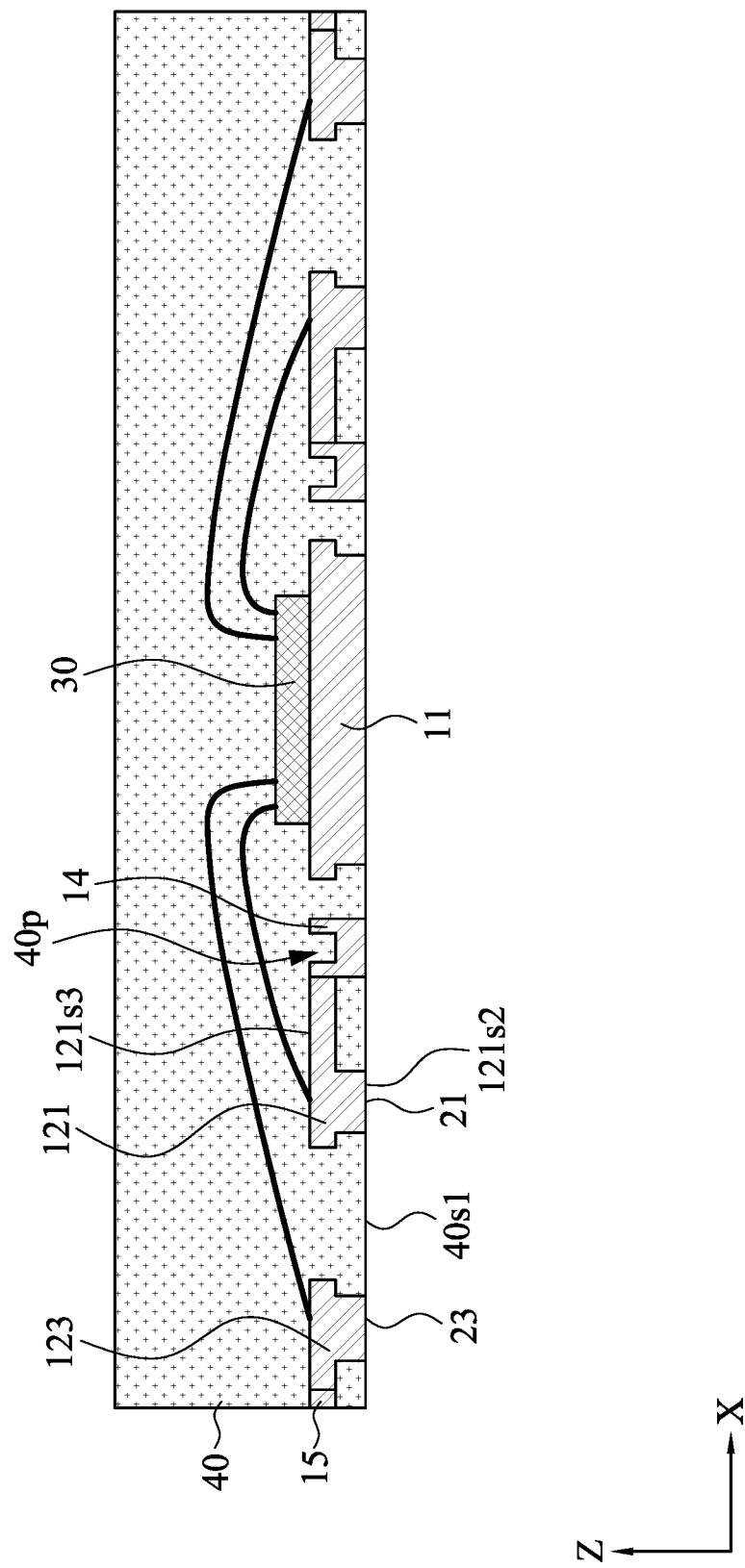
Figure 11C:
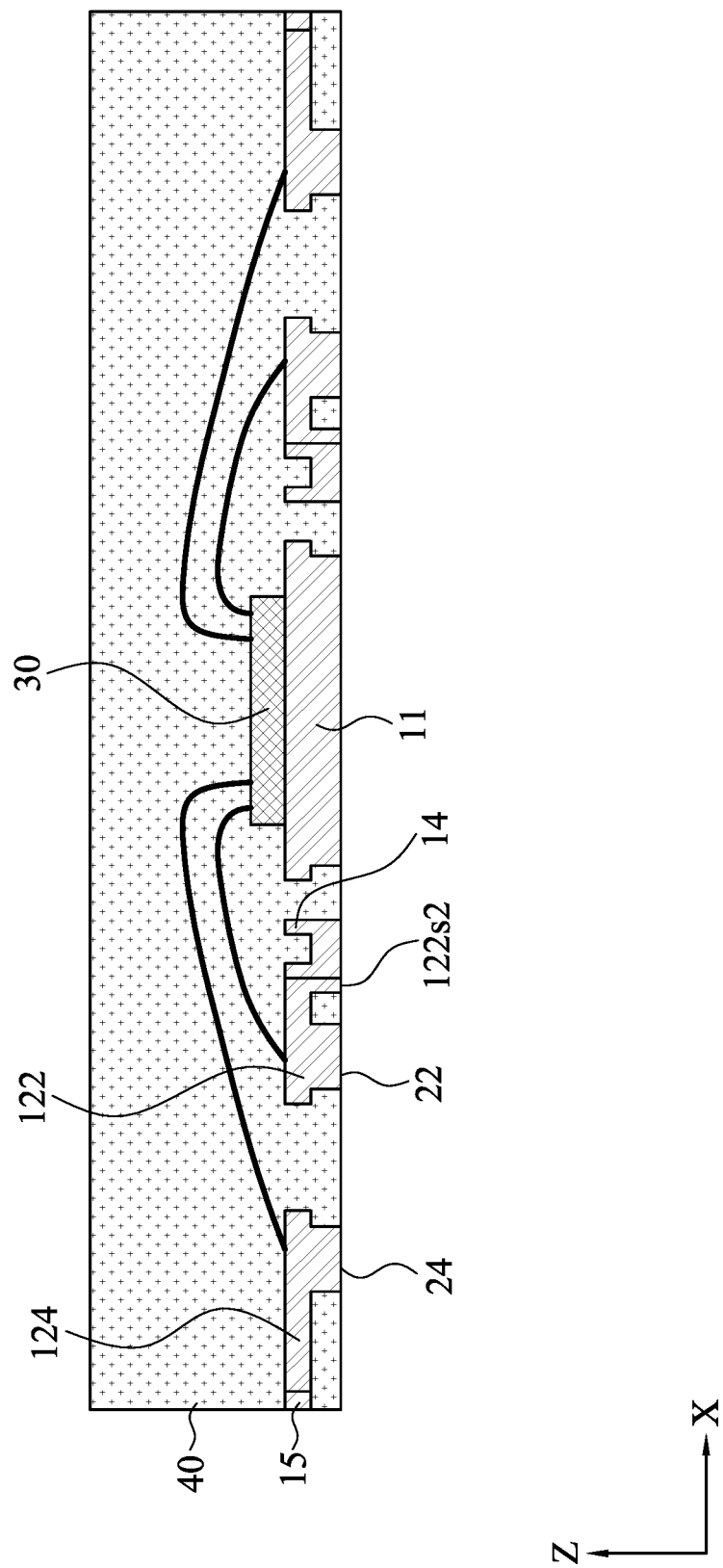

As shown in FIGS. 11B and 11C, the encapsulant 40 may fill the blind hole 121$o$1 of the supporting bar 121 and the blind hole 122$o$1 of the supporting bar 122. In some embodiments, the encapsulant 40 may fill the blind hole 121$o$2 such that the protruding portion 40$p$ is formed. In some embodiments, a portion of the surface 122$s$2 of the supporting bar 122 may be exposed from the encapsulant 40. In some embodiments, the lower surface of the supporting bar 121 may be covered by the terminal 21 or the encapsulant 40.

Figure 12A:
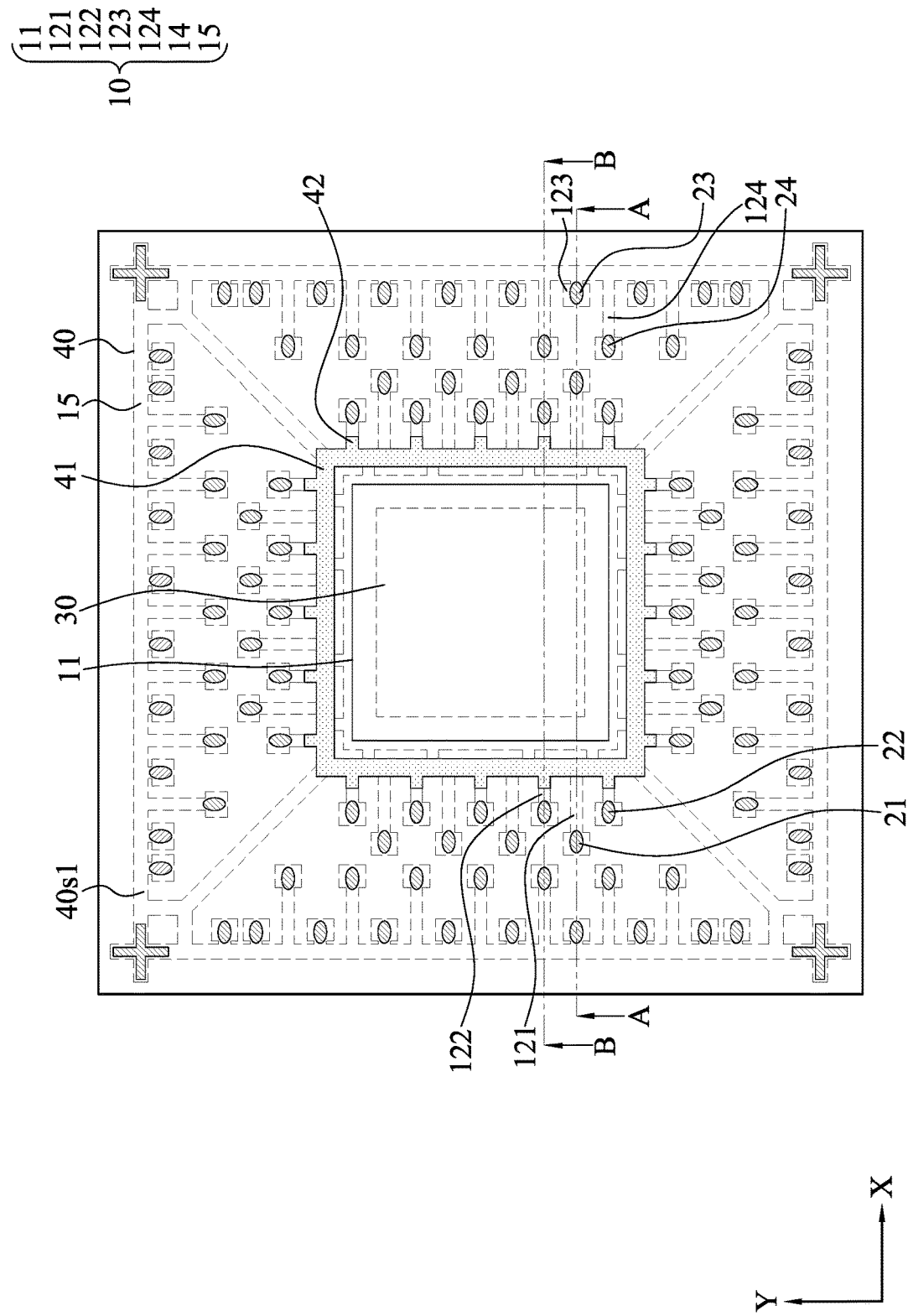

Referring to FIG. 12A, the linking bar 14 is removed. In some embodiments, a portion of the supporting bar 122 may be removed. More specifically, the exposed portions of the linking bar 14 and the supporting bar 122 from the encapsulant 40 are removed. As a result, a recess 41 and a plurality of the recesses 42 may be formed. In some embodiments, the linking bar 14 and the portion of the supporting bar 122 may be removed by an etching process. By an etching process, such as a wet etching process, the linking bar 14 and the portion of the supporting bar 122 may be removed in one step of an etching process. In some embodiments, the supporting bar 121 may not be removed in the wet etching process.

Figure 12B:
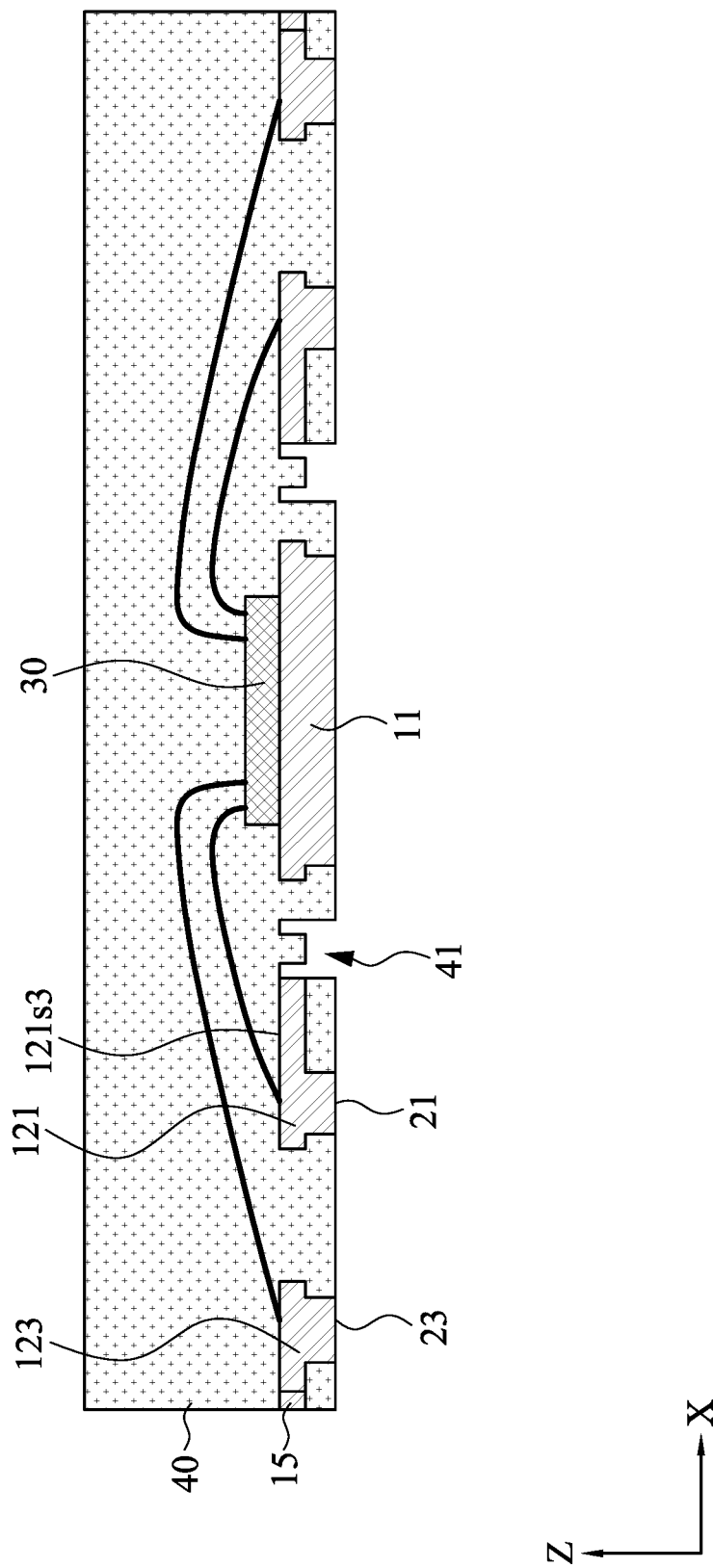
Figure 12C:
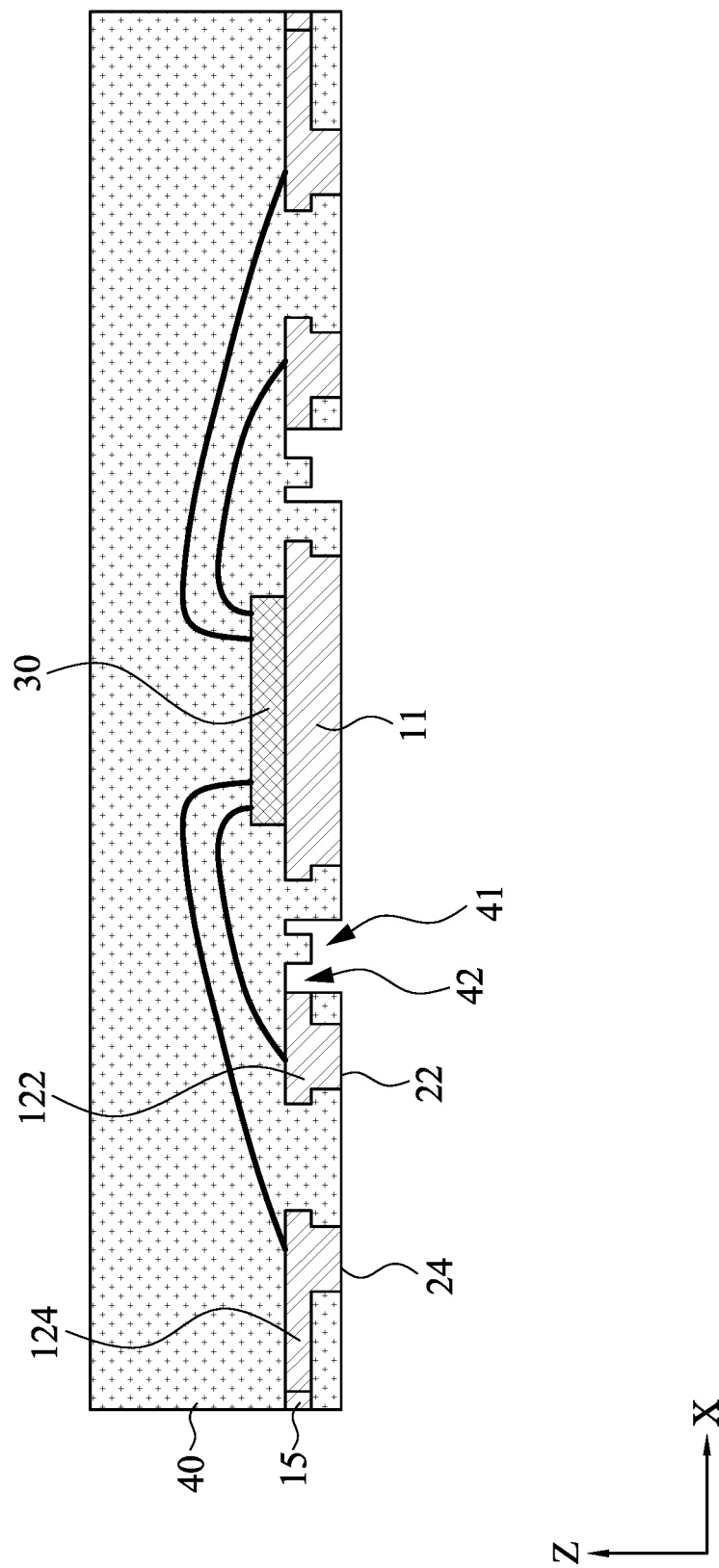

As shown in FIGS. 12B and 12C, after the linking bar 14 and the portion of the supporting bar 122 may be removed, the protruding portion 40p may be exposed from the encapsulant 40. Further, the surface 121s1 of the supporting bar 121 and the surface 122s1 of the supporting bar 122 may be exposed. After the linking bar 14 is removed, the supporting bar 121 is electrically isolated from the supporting bar 122.

Referring to 13A, 13B and 13C, the linking bar 15 and a portion of the encapsulant 40 may be removed. As a result, a semiconductor package structure 1a may be produced. In some embodiments, the linking bar 15 and the portion of the encapsulant 40 may be removed by a cutting process.

Figure 13A:
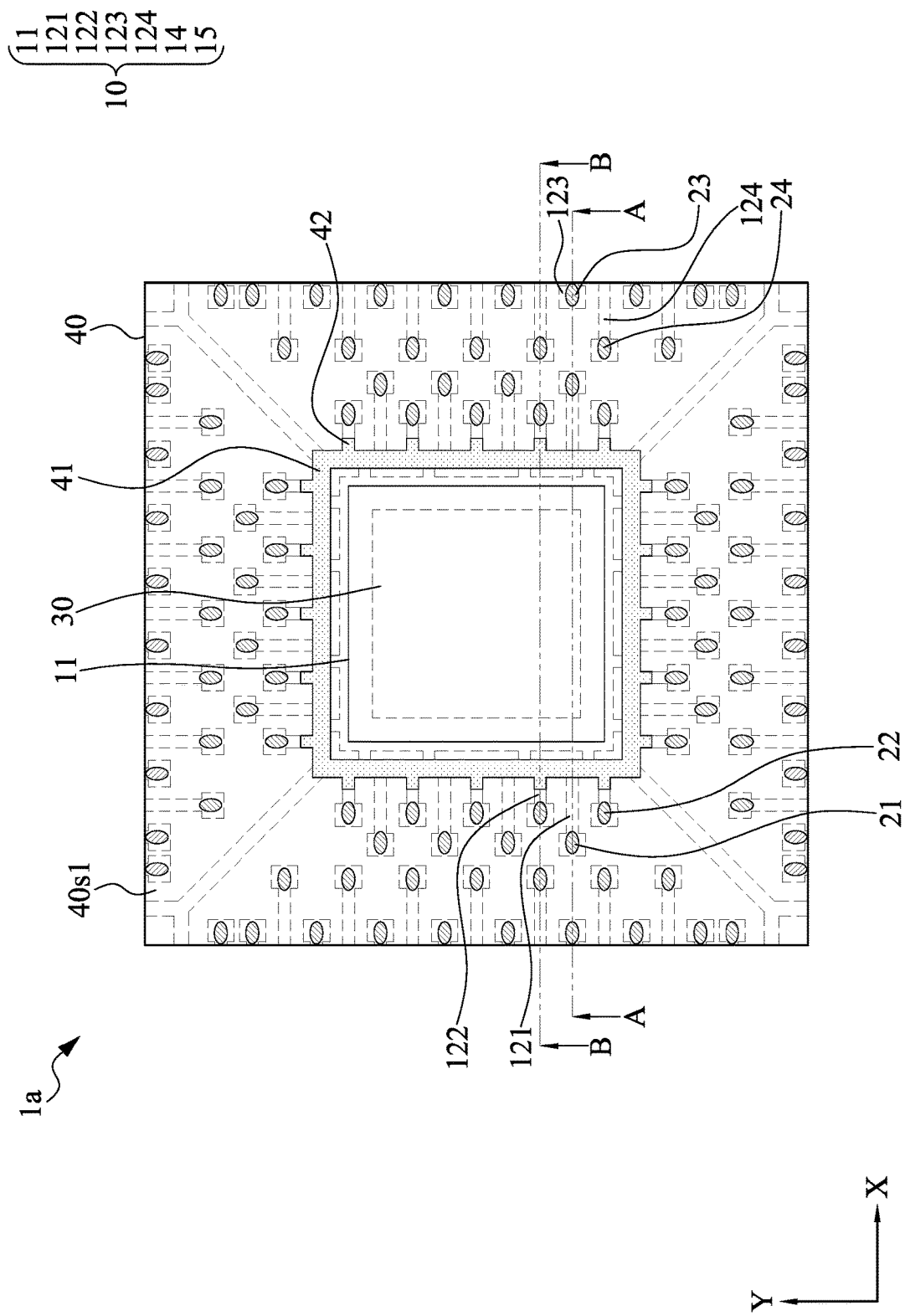
Figure 13B:
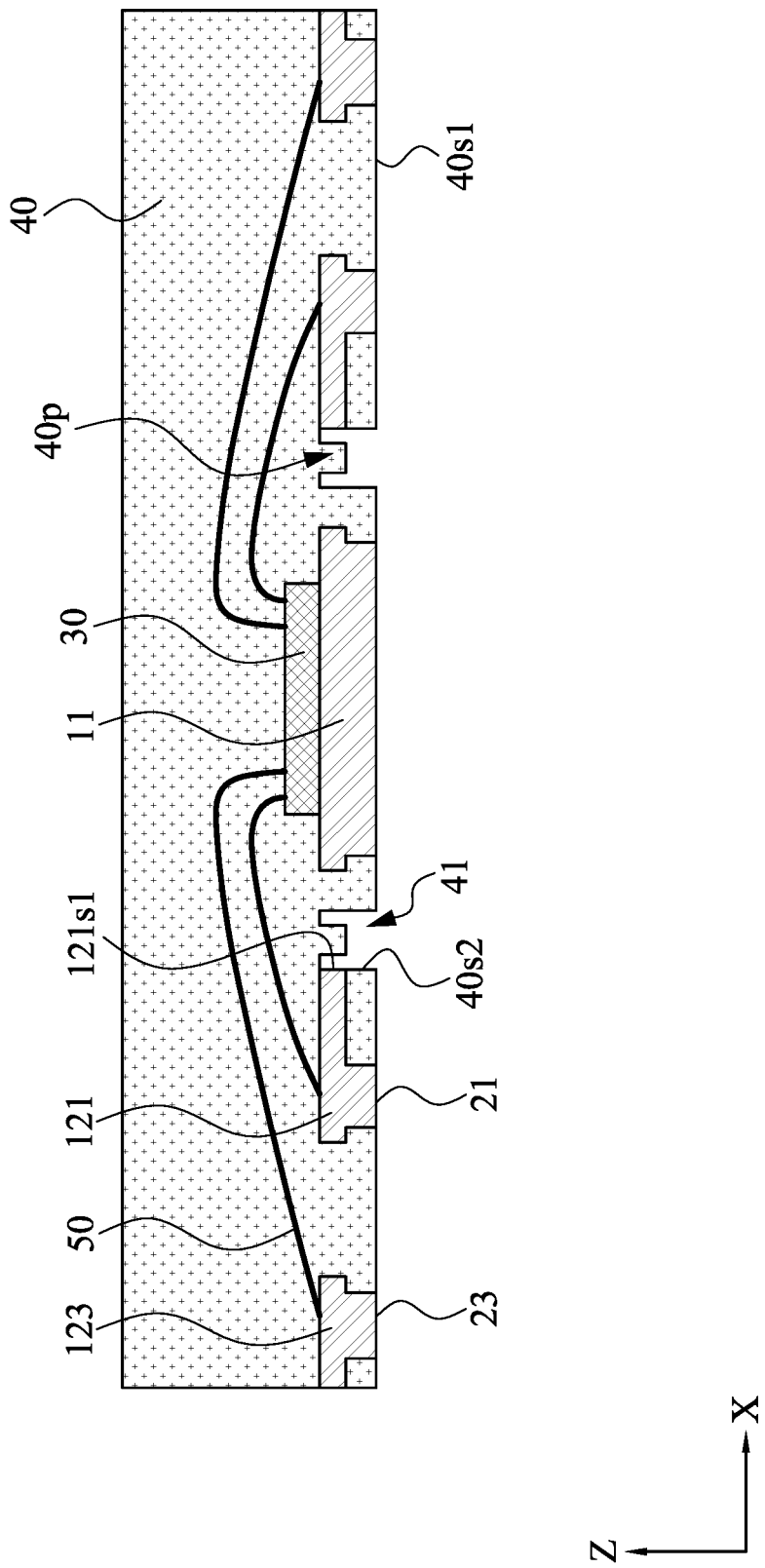
Figure 13C:
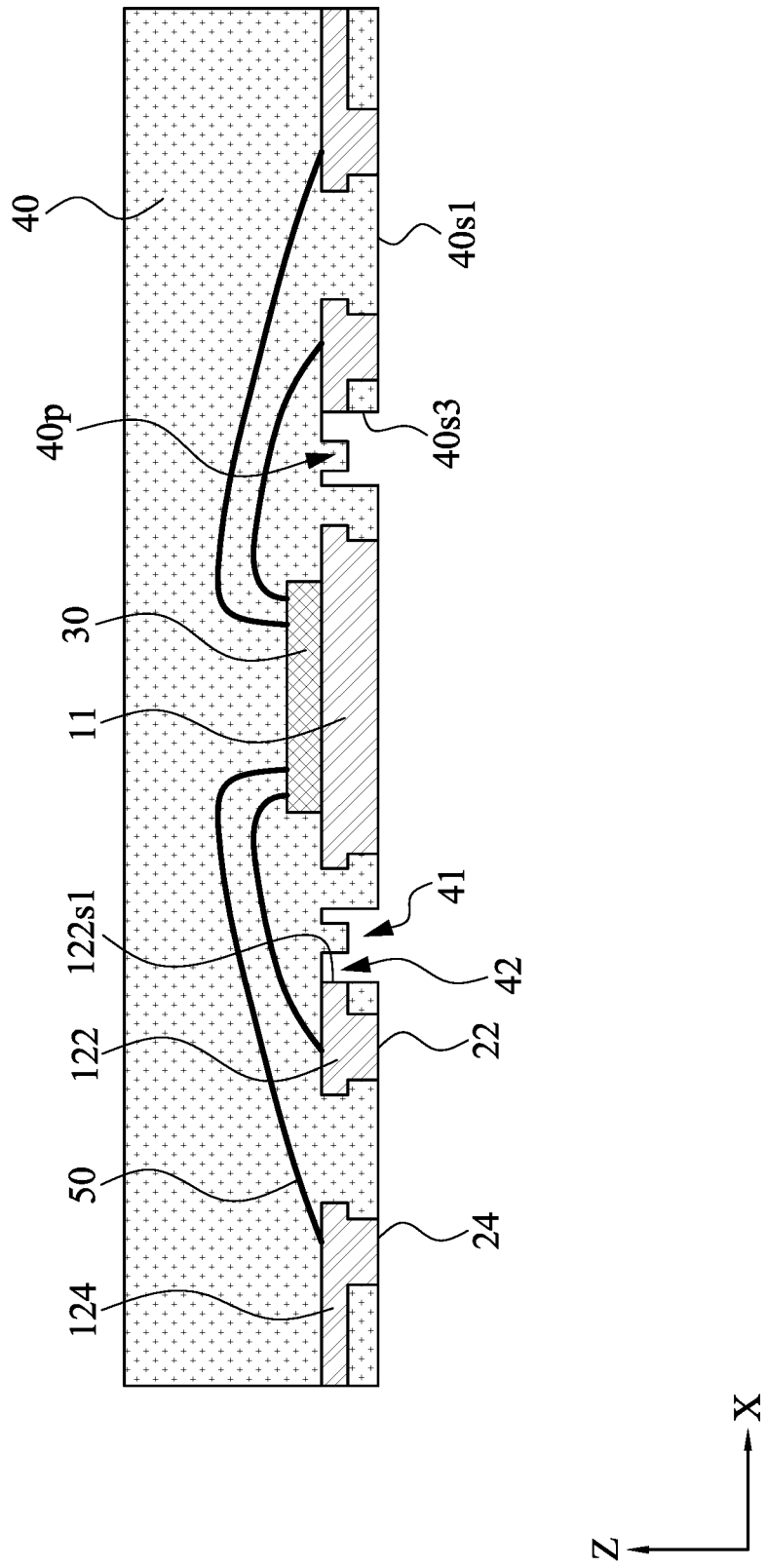

It is contemplated that in FIG. 11A, if the supporting bar 121 has a portion exposed from the surface 40s2 of the encapsulant, a semiconductor package structure same or similar to the semiconductor package structure 1b as illustrated and described with reference to FIG. 5 can be formed with the following operations as illustrated and described with reference to FIGS. 12A and 13A.

It is contemplated that in FIGS. 10A, 10B and 10C, if the chip 30 is bonded to the lead frame 10 through a flip-chip technique, a semiconductor package structure same or similar to the semiconductor package structure 1c as illustrated and described with reference to FIG. 8 can be formed with the following operations as illustrated and described with reference to FIG. 11A, FIGS. 12A and 13A.

It is contemplated that in FIG. 10A, if the lead frame 10 has an additional inner linking bar, a semiconductor package structure same or similar to the semiconductor package structure 1d as illustrated and described with reference to FIG. 9 can be formed with the following operations as illustrated and described with reference to FIGS. 11A, 12A and 13A.

The semiconductor package structure of the present disclosure includes a main recess and multiple sub recesses. The main recess may be configured to assist in reducing the length of supporting bars, thereby preventing deformation of the supporting bars. The sub recesses may be configured to accommodate excessive solder material during attaching a motherboard to the semiconductor package structure, thereby preventing from excessive solder material connecting two terminals incurring short circuit. Accordingly, reliability of semiconductor package structure can be increased.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between the highest point and the lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
    a first supporting bar;
    a second supporting bar adjacent to the first supporting bar, wherein the first supporting bar and the second supporting bar extend substantially along a first direction; and
    an encapsulant covering the first supporting bar and the second supporting bar, wherein the encapsulant defines a first recess and a second recess recessed from a lower surface of the encapsulant, the first recess extends substantially along a second direction different from the first direction, and the second recess is located between the first recess and the second supporting bar, wherein the second recess has a closed end exposing a lateral surface of the second supporting bar and an open end connecting the first recess, and an aperture of the second recess tapers off from the closed end to the open end of the second recess.

2. The semiconductor package structure of claim 1, further comprising:
    a die paddle, wherein the first recess is located between the die paddle and the first supporting bar.

3. The semiconductor package structure of claim 1, wherein the second recess connects and extends toward the second supporting bar along the first direction.

4. The semiconductor package structure of claim 1, further comprising:
    a third recess located between the first recess and the first supporting bar.

5. The semiconductor package structure of claim 1, further comprising:
    a first terminal disposed on the lower surface of the encapsulant, wherein the first terminal covers a lower surface of the first supporting bar.

6. The semiconductor package structure of claim 1, wherein the encapsulant has a protruding portion exposed from the first recess.

7. The semiconductor package structure of claim 1, further comprising:
    a third supporting bar spaced apart from the first recess and the second recess.

8. The semiconductor package structure of claim 1, wherein the first supporting bar has a first length along the first direction, the second supporting bar has a second length along the first direction, and the first length is greater than the second length.

9. The semiconductor package structure of claim 1, wherein a lateral surface of the first supporting bar is exposed from at least one of the first recess or the second recess.

10. The semiconductor package structure of claim 2, further comprising;
    a semiconductor die disposed on the die paddle.

11. The semiconductor package structure of claim 5, further comprising:
    a die paddle, wherein the first recess is located between the die paddle and the first supporting bar; and
    a second terminal disposed on the lower surface of the encapsulant, wherein the first terminal is positioned farther from the die paddle than the second terminal is from the die paddle.

12. The semiconductor package structure of claim 7, wherein the first supporting bar is disposed between the die paddle and the third supporting bar.

13. The semiconductor package structure of claim 10, further comprising:
    a wire bond connecting the die paddle and the first supporting bar.

14. The semiconductor package structure of claim 11, wherein the second recess is located between the second terminal and the die paddle.

* * * * *